(12) United States Patent
Zhang et al.

(10) Patent No.: US 12,089,472 B2
(45) Date of Patent: *Sep. 10, 2024

(54) DISPLAY PANEL AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Bo Zhang, Beijing (CN); Xiangdan Dong, Beijing (CN); Rong Wang, Beijing (CN); Jie Gou, Beijing (CN); Bo Cheng, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/317,798

(22) Filed: May 15, 2023

(65) Prior Publication Data

US 2023/0284505 A1 Sep. 7, 2023

Related U.S. Application Data

(63) Continuation of application No. 17/261,923, filed as application No. PCT/CN2020/083962 on Apr. 9, 2020, now Pat. No. 11,696,480.

(51) Int. Cl.
*H10K 59/40* (2023.01)
*G06F 3/044* (2006.01)
(Continued)

(52) U.S. Cl.
CPC ........... *H10K 59/40* (2023.02); *G06F 3/0446* (2019.05); *H10K 50/844* (2023.02);
(Continued)

(58) Field of Classification Search
CPC .... H10K 59/40; H10K 50/844; H10K 59/122; H10K 59/131; H10K 77/111;
(Continued)

(56) References Cited

U.S. PATENT DOCUMENTS 11,696,480 B2 * 7/2023 Zhang .................. G06F 3/0446
257/40
2018/0033831 A1 2/2018 An et al.
(Continued)

FOREIGN PATENT DOCUMENTS

WO 2019030887 A1 2/2019
WO 2019038884 A1 2/2019

OTHER PUBLICATIONS

Japan Patent Office, First Office Action issued Mar. 4, 2024 for application No. JP2021-568085.

*Primary Examiner* — Kyoung Lee
(74) *Attorney, Agent, or Firm* — HOUTTEMAN LAW LLC

(57) ABSTRACT

Disclosed are a display panel and a display device, the display panel including: a substrate including a display area, a peripheral area and a welding area; at least one barrier in the peripheral area and surrounding the display area, the barrier including a single-sided barrier structure between the display area and the welding area; an organic insulating structure including sub-insulating structures, each sub-insulating structure having a first boundary located between the display area and the single-sided barrier structure, for any two adjacent sub-insulating structures, the first boundary of the sub-insulating structure on a side away from the substrate being closer to the display area than the first boundary of the sub-insulating structure on a side proximal to the substrate; a distance between first boundaries of any two (Continued)

adjacent sub-insulating structures is greater than or equal to 20 μm; a touch electrode pattern; and a touch signal line.

20 Claims, 10 Drawing Sheets

(51) Int. Cl.
  *H10K 50/844* (2023.01)
  *H10K 59/122* (2023.01)
  *H10K 59/131* (2023.01)
  *H10K 77/10* (2023.01)
(52) U.S. Cl.
  CPC ......... *H10K 59/122* (2023.02); *H10K 59/131* (2023.02); *H10K 77/111* (2023.02); *G06F 2203/04111* (2013.01)

(58) Field of Classification Search
  CPC ......... G06F 3/0446; G06F 2203/04111; G06F 2203/04103; G06F 3/0412; G06F 3/04164; G06F 3/0443; H01L 51/0097; H01L 27/3246; H01L 27/3258; H01L 27/3276; H01L 51/5253; H01L 27/323; H01L 27/3244; H01L 51/5203; H01L 51/5237; H01L 51/524; Y02E 10/549
  See application file for complete search history.

(56) References Cited

U.S. PATENT DOCUMENTS

| | | |
|---|---|---|
| 2018/0331160 A1 | 11/2018 | Beak et al. |
| 2019/0131375 A1 | 5/2019 | Kim et al. |
| 2020/0091252 A1 | 3/2020 | Bang et al. |
| 2020/0105840 A1 | 4/2020 | Choi et al. |

\* cited by examiner

DISPLAY PANEL AND DISPLAY DEVICE

CROSS-REFERENCE TO RELATED APPLICATIONS

This is a Continuation of U.S. patent application Ser. No. 17/261,923, filed Jan. 21, 2021, a National Phase Application filed under 35 U.S.C. 371 as a national stage of PCT/CN2020/083962 filed on Apr. 9, 2020, the content of each of which is hereby incorporated by reference in its entirety.

TECHNICAL FIELD

The present disclosure relates to the technical field of display, and in particular to a display panel and a display device.

BACKGROUND

With development of Organic Light Emitting Diode (OLED) display technology, OLED display devices are widely used. In order to meet requirements of users on a thickness of a product and a touch experience, in a production process, a touch functional layer is manufactured on an encapsulation layer of an OLED display panel.

SUMMARY

Embodiments of the present disclosure provide a display panel and a display device.

According to a first aspect of the present disclosure, there is provided a display panel including:
  a substrate, including a display area, a peripheral area and a welding area, where the peripheral area surrounds the display area, and the welding area is positioned on a side of the peripheral area away from the display area;
  at least one barrier disposed on the substrate, the barrier being located in the peripheral area and surrounding the display area, the barrier including a single-sided barrier structure located between the display area and the welding area;
  an organic insulating structure disposed on the substrate, the organic insulating structure including a plurality of sub-insulating structures disposed in a stacked manner, a portion of each of the sub-insulating structures being located in the display area, each of the sub-insulating structures having a first boundary located between the display area and the single-sided barrier structure, where for any adjacent two of the sub-insulating structures, the first boundary of the sub-insulating structure on a side away from the substrate is closer to the display area than the first boundary of the sub-insulating structure on a side proximal to the substrate; a distance between first boundaries of any two adjacent sub-insulating structures is greater than or equal to 20 µm;
  a touch electrode pattern arranged on a side of the organic insulating structure away from the substrate;
  a touch signal line arranged on the side of the organic insulating structure away from the substrate, a terminal of the touch signal line is electrically coupled to the touch electrode pattern, another terminal of the touch signal line is coupled to the welding area, and an orthographic projection of a portion of the touch signal line in the peripheral area on the substrate is intersected with the first boundary of each of the sub-insulating structures.

In some implementations, the distance between the first boundaries of any two adjacent sub-insulating structures ranges from 25 µm to 60 µm.

In some implementations, the sub-insulating structures of the organic insulating structure include:
  a first planarization layer disposed on the substrate;
  a second planarization layer located on a side of the first planarization layer away from the substrate;
  a pixel defining layer positioned on a side of the second planarization layer away from the substrate.

In some implementations, a space exists between the first boundary of the sub-insulating structure and the single-sided barrier structure.

In some implementations, the display panel further includes: an encapsulation layer arranged on a side of the organic insulating structure away from the substrate; the touch electrode pattern and the touch signal line are both positioned on a side of the encapsulation layer away from the substrate.

In some implementations, the encapsulation layer includes:
  a first inorganic encapsulation layer;
  a second inorganic encapsulation layer positioned on a side of the first inorganic encapsulation layer away from the substrate;
  an organic encapsulation layer located between the first inorganic encapsulation layer and the second inorganic encapsulation layer.

In some implementations, a recess is formed between the organic insulating structure and the single-sided barrier structure, and an orthographic projection of the encapsulation layer on the substrate simultaneously covers an orthographic projection of the organic insulating structure on the substrate, an orthographic projection of the recess on the substrate, and an orthographic projection of the single-sided barrier structure on the substrate, the single-sided barrier structure being located between the substrate and the encapsulation layer.

In some implementations, the display panel further includes: a touch insulating layer arranged on a side of the encapsulation layer away from the substrate;
  the touch electrode pattern includes a plurality of touch driving electrodes and a plurality of touch sensing electrodes, the touch driving electrodes intersect with the touch sensing electrodes, the touch driving electrodes and the touch sensing electrodes are insulated and spaced from each other by the touch insulating layer at intersection positions between the touch driving electrodes and the touch sensing electrodes, and each of the touch driving electrode and the touch sensing electrode is correspondingly coupled to one touch signal line.

In some implementations, the touch driving electrodes include: a plurality of driving electrode elements arranged along a first direction and coupling parts coupled between every two adjacent driving electrode elements;
  the touch sensing electrodes include: a plurality of sensing electrode elements arranged along a second direction, and bridge parts coupled between every two adjacent sensing electrode elements;
  where the first direction intersects with the second direction, the driving electrode elements, the coupling parts and the sensing electrode elements are located on a side of the touch insulating layer away from the substrate and located in a single layer, and the bridge parts are located between the touch insulating layer and the encapsulation layer.

In some implementations, the touch signal line includes a first transmission portion and a second transmission portion, the first transmission portion is located between the touch insulating layer and the encapsulation layer, the second transmission portion is located on a side of the touch insulating layer away from the encapsulation layer, and the second transmission portion is electrically coupled to the first transmission portion through a via hole penetrating through the touch insulating layer.

In some implementations, the display area includes a plurality of pixel units each having a light emitting element disposed therein, and the display panel further includes a power supply line electrically coupled to the light emitting element, where the power supply line is located between the organic insulating structure and the substrate, and an orthogonal projection of the power supply line on the substrate overlaps an orthogonal projection of the first boundary on the substrate.

In some implementations, the barrier includes:
a first barrier located in the peripheral area and surrounding the display area;
a second barrier located in the peripheral area and surrounding the first barrier;
where a portion of the first barrier between the display area and the welding area, and a portion of the second barrier between the display area and the welding area constitute the single-sided barrier structure.

In some implementations, the substrate is a flexible substrate and further includes a bending area between the peripheral area and the welding area.

In some implementations, the display panel further includes:
a first buffer layer disposed on the substrate;
a semiconductor layer disposed between the first buffer layer and the first planarization layer;
a first gate insulating layer disposed between the semiconductor layer and the first planarization layer;
a first gate electrode layer provided between the first gate insulating layer and the first planarization layer;
a second gate insulating layer provided between the first gate electrode layer and the first planarization layer;
a second gate electrode layer provided between the second gate insulating layer and the first planarization layer;
an interlayer insulating layer provided between the second gate electrode layer and the first planarization layer;
a first source-drain conductive layer arranged between the interlayer insulating layer and the first planarization layer;
a passivation layer arranged between the first source-drain conductive layer and the first planarization layer;
a second source-drain conductive layer arranged between the first planarization layer and the second planarization layer;
a first electrode layer disposed between the second planarization layer and the pixel defining layer, the first electrode layer including a plurality of first electrodes, the pixel defining layer including pixel openings in one-to-one correspondence with the first electrodes;
a light emitting layer disposed in the pixel openings;
a second electrode layer arranged on a side of the light emitting layer away from the substrate;
an encapsulation layer arranged on a side of the light emitting layer away from the substrate;
a second buffer layer arranged on a side of the encapsulation layer away from the substrate.

According to a second aspect of the present disclosure, there is provided a display panel including:
a substrate including a display area, a peripheral area and a welding area, where the peripheral area surrounds the display area, and the welding area is positioned on a side of the peripheral area away from the display area;
at least one barrier disposed on the substrate, the barrier being located in the peripheral area and surrounding the display area, the barrier including a single-sided barrier structure located between the display area and the welding area;
an organic insulating structure arranged on the substrate, a portion of the organic insulating structure is located in the display area, another portion of the organic insulating structure is located in the peripheral area, the organic insulating structure is provided with a bottom surface facing the substrate, a top surface opposite to the bottom surface, and a first side surface coupled between the bottom surface and the top surface and facing the single-side barrier structure, the first side surface is a slope surface, and a slope angle of the slope surface ranges from 0° to 40°;
a touch electrode pattern arranged on a side of the organic insulating structure away from the substrate;
a touch signal line arranged on a side of the organic insulating structure away from the substrate, a terminal of the touch signal line is electrically coupled to the touch electrode pattern, another terminal of the touch signal line is coupled to the welding area, and an orthographic projection of a portion of the touch signal line in the peripheral area on the substrate passes through an orthographic projection of the slope surface on the substrate.

In some implementations, the slope angle of the slope surface ranges from 25° to 35°.

In some implementations, a plurality of sub-insulating structures of the organic insulating structure includes:
a first planarization layer disposed on the substrate;
a second planarization layer located on a side of the first planarization layer away from the substrate;
a pixel defining layer positioned on a side of the second planarization layer away from the substrate.

In some implementations, a space exists between the first side surface and the single-sided barrier structure.

In some implementations, the display panel further includes: an encapsulation layer arranged on a side of the organic insulating structure away from the substrate;
the touch electrode pattern and the touch signal line are both positioned on a side of the encapsulation layer away from the substrate.

In some implementations, the encapsulation layer includes:
a first inorganic encapsulation layer;
a second inorganic encapsulation layer positioned on a side of the first inorganic encapsulation layer away from the substrate;
an organic encapsulation layer located between the first inorganic encapsulation layer and the second inorganic encapsulation layer.

In some implementations, a recess is formed between the organic insulating structure and the single-sided barrier structure, and an orthographic projection of the encapsulation layer on the substrate simultaneously covers an orthographic projection of the organic insulating structure on the substrate, an orthographic projection of the recess on the substrate, and an orthographic projection of the single-sided barrier structure on the substrate, the single-sided barrier structure being located between the substrate and the encapsulation layer.

In some implementations, the display panel further includes: a touch insulating layer arranged on a side of the encapsulation layer away from the substrate;

the touch electrode pattern includes a plurality of touch driving electrodes and a plurality of touch sensing electrodes, the touch driving electrodes intersect with the touch sensing electrodes, the touch driving electrodes and the touch sensing electrodes are insulated and spaced from each other by the touch insulating layer at intersection positions between the touch driving electrodes and the touch sensing electrodes, and each of the touch driving electrode and the touch sensing electrode is correspondingly coupled to one touch signal line.

In some implementations, the touch driving electrodes include: a plurality of driving electrode elements arranged along a first direction and coupling parts coupled between every two adjacent driving electrode elements;

the touch sensing electrodes include: a plurality of sensing electrode elements arranged along a second direction, and bridging parts coupled between every two adjacent sensing electrode elements;

the first direction intersects with the second direction, the driving electrode elements, the coupling parts and the sensing electrode elements are located on a side of the touch insulating layer away from the substrate, and located in a single layer, and the bridging parts are located between the touch insulating layer and the encapsulation layer.

In some implementations, the touch signal line includes a first transmission portion and a second transmission portion, the first transmission portion is located between the touch insulating layer and the encapsulation layer, the second transmission portion is located on a side of the touch insulating layer away from the encapsulation layer, and the second transmission portion is electrically coupled to the first transmission portion through a via hole penetrating through the touch insulating layer.

In some implementations, the display area includes a plurality of pixel units, each of the pixel units having a light emitting element disposed therein, and the display panel further includes a power supply line electrically coupled to the light emitting element, where the power supply line is located between the organic insulating structure and the substrate, and an orthogonal projection of the power supply line on the substrate overlaps an orthogonal projection of the first side surface on the substrate.

In some implementations, the barrier includes:
a first barrier located in the peripheral area and surrounding the display area;
a second barrier located at the peripheral area and surrounding the first barrier;
where a portion of the first barrier between the display area and the welding area, and a portion of the second barrier between the display area and the welding area constitute the single-sided barrier structure.

In some implementations, the substrate is a flexible substrate further including a bending area between the peripheral area and the welding area.

In some implementations, the display panel further includes:
a first buffer layer disposed on the substrate;
a semiconductor layer disposed between the first buffer layer and the first planarization layer;
a first gate insulating layer disposed between the semiconductor layer and the first planarization layer;
a first gate electrode layer provided between the first gate insulating layer and the first planarization layer;
a second gate insulating layer provided between the first gate electrode layer and the first planarization layer;
a second gate electrode layer provided between the second gate insulating layer and the first planarization layer;
an interlayer insulating layer provided between the second gate electrode layer and the first planarization layer;
a first source-drain conductive layer arranged between the interlayer insulating layer and the first planarization layer;
a passivation layer arranged between the first source-drain conductive layer and the first planarization layer;
a second source-drain conductive layer arranged between the first planarization layer and the second planarization layer;
a first electrode layer disposed between the second planarization layer and the pixel defining layer, the first electrode layer including a plurality of first electrodes, the pixel defining layer including pixel openings in one-to-one correspondence with the first electrodes;
a light emitting layer disposed in the pixel openings;
a second electrode layer arranged on a side of the light emitting layer away from the substrate;
an encapsulation layer arranged on a side of the light emitting layer away from the substrate;
a second buffer layer arranged on a side of the encapsulation layer away from the substrate.

According to a third aspect of the present disclosure, there is provided a display panel including:
a substrate including a display area, a peripheral area and a welding area, where the peripheral area surrounds the display area, and the welding area is positioned on a side of the peripheral area far away from the display area;
at least one barrier disposed on the substrate, the barrier being located in the peripheral area and surrounding the display area, the barrier including a single-sided barrier structure located between the display area and the welding area;
an organic insulating structure disposed on the substrate, the organic insulating structure including a plurality of sub-insulating structures disposed in a stacked manner, a portion of each of the sub-insulating structures being located in the display area, each of the sub-insulating structures having a first boundary between the display area and the single-sided barrier structure, each of the sub-insulating structures except the sub-insulating structure farthest from the substrate including an extension part; for any two adjacent sub-insulating structures, the extension part of the sub-insulating structure proximal to the substrate is positioned between the first boundary of the sub-insulating structure away from the substrate and the single-side barrier structure;
a touch electrode pattern arranged on a side of the organic insulating structure away from the substrate;
a touch signal line arranged on a side of the organic insulating structure away from the substrate, a terminal of the touch signal line is electrically coupled to the touch electrode pattern, another terminal of the touch signal line is coupled to the welding area, and an orthographic projection of a portion, in the peripheral area, of the touch signal line on the substrate overlaps with an orthographic projection of the extension part of each sub-insulating structure on the substrate;

where the sub-insulating structure with the extension portion is formed by patterning an organic material layer by using a two-tone mask plate, and during a process of patterning, an area where the extension portion is to be formed corresponds to a semi-light-transmitting area of the two-tone mask plate.

In some implementations, the sub-insulating structures of the organic insulating structure include:

a first planarization layer disposed on the substrate;

a second planarization layer located on a side of the first planarization layer away from the substrate;

a pixel defining layer positioned on a side of the second planarization layer away from the substrate.

According to a fourth aspect of the present disclosure, there is provided a display device, which includes the above display panel.

DESCRIPTION OF DRAWINGS

The accompanying drawings, which are included to provide a further understanding of the present disclosure and constitute a part of this specification, are used to explain the present disclosure in conjunction with the following specific embodiments, but do not constitute a limitation of the present disclosure. In the drawings.

DESCRIPTION OF EMBODIMENTS

To make objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only a few embodiments of the present disclosure, and not all embodiments. All other embodiments, which can be derived by a person skilled in the art from the described embodiments of the present disclosure without creative labor, are within the protective scope of the present disclosure.

The terminologies used herein to describe embodiments of the present disclosure are not intended to limit and/or define the scope of the present disclosure. For example, unless defined otherwise, technical or scientific terms used in the present disclosure should have the same meanings as commonly understood by one of ordinary skill in the art to which the present disclosure belongs. It should be understood that the terms "first", "second", and the like, as used in the present disclosure, do not denote any order, quantity, or importance, but rather are used to distinguish one element from another. The singular forms "a", "an", or "the" and similar referents do not denote a limitation of quantity, but rather denote the presence of at least one, unless the context clearly dictates otherwise. The word "include" or "including", and the like, means that the element or item appearing in front of the word "include" or "including" includes the element or item listed after the word "include" or "including" and its equivalents, and does not exclude other elements or items. The terms "coupled" or "coupling" and the like are not restricted to physical or mechanical connections, but may include electrical connections, whether direct or indirect. The terms "upper", "lower", "left", "right", and the like are used merely to indicate relative positional relationships, which may be changed accordingly when an absolute position of the object being described changes.

In the following description, when an element or layer is referred to as being "on" or "coupled to" another element or layer, it can be directly on, coupled to, or intervening elements or layers may be present. However, when an element or layer is referred to as being "directly on" or "directly coupled to" another element or layer, there are no intervening elements or layers present. The term "and/or" includes any and all combinations of one or more of the associated listed items.

Figure 1:
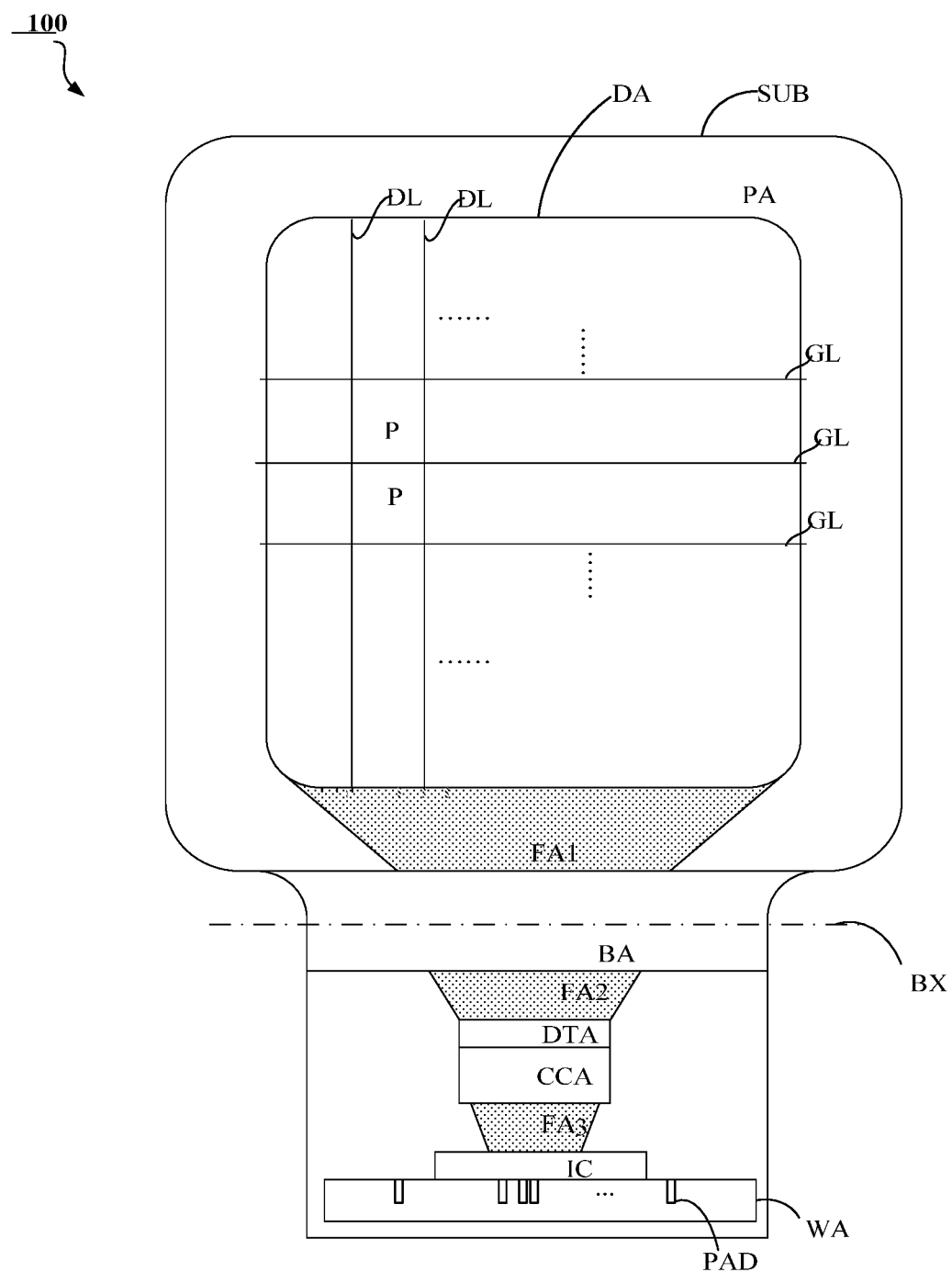
FIG. 1 is a schematic diagram illustrating an area division of a substrate of a display panel according to an embodiment of the present disclosure.

An embodiment of the present disclosure provides a display panel, which includes a substrate, and FIG. 1 is a schematic diagram of an area division of the substrate of the display panel according to an embodiment of the present disclosure, and as shown in FIG. 1, the substrate SUB includes: a display area DA, a peripheral area PA and a welding area WA, where the peripheral area PA surrounds the display area DA, and the welding area WA is located on a side of the peripheral area PA away from the display area DA. Elements for displaying an image, for example, pixel circuits, scan lines GL, data lines DL, light emitting elements, and the like may be disposed in the display area DA. In addition, the display area DA may further be provided with a touch electrode pattern to implement a touch function. The welding area WA is located on a side of the peripheral area PA away from the display area DA, and includes a plurality of contact pads (or welding pads) PAD, each of which is configured to be electrically coupled to a signal line extending from the display area DA or the peripheral area PA. For example, a data line DL may be coupled to the contact pad through a data coupling line. The contact pads PAD may be exposed on a surface of the welding area WA, i.e., not covered by any layer, so as to facilitate being electrically coupled to a flexible print circuit board (FPCB).

The flexible printed circuit board (FPCB) is electrically coupled to an external controller, and configured to transmit a signal from the external controller. The contact pads PAD are electrically coupled to signal lines, thereby achieving mutual communication between the signal lines and the flexible printed circuit board (FPCB). It should be understood that the number and an arrangement of the contact pads PAD in FIG. 1 are only illustrative and do not constitute a limitation on the contact pads PAD.

Figure 2:
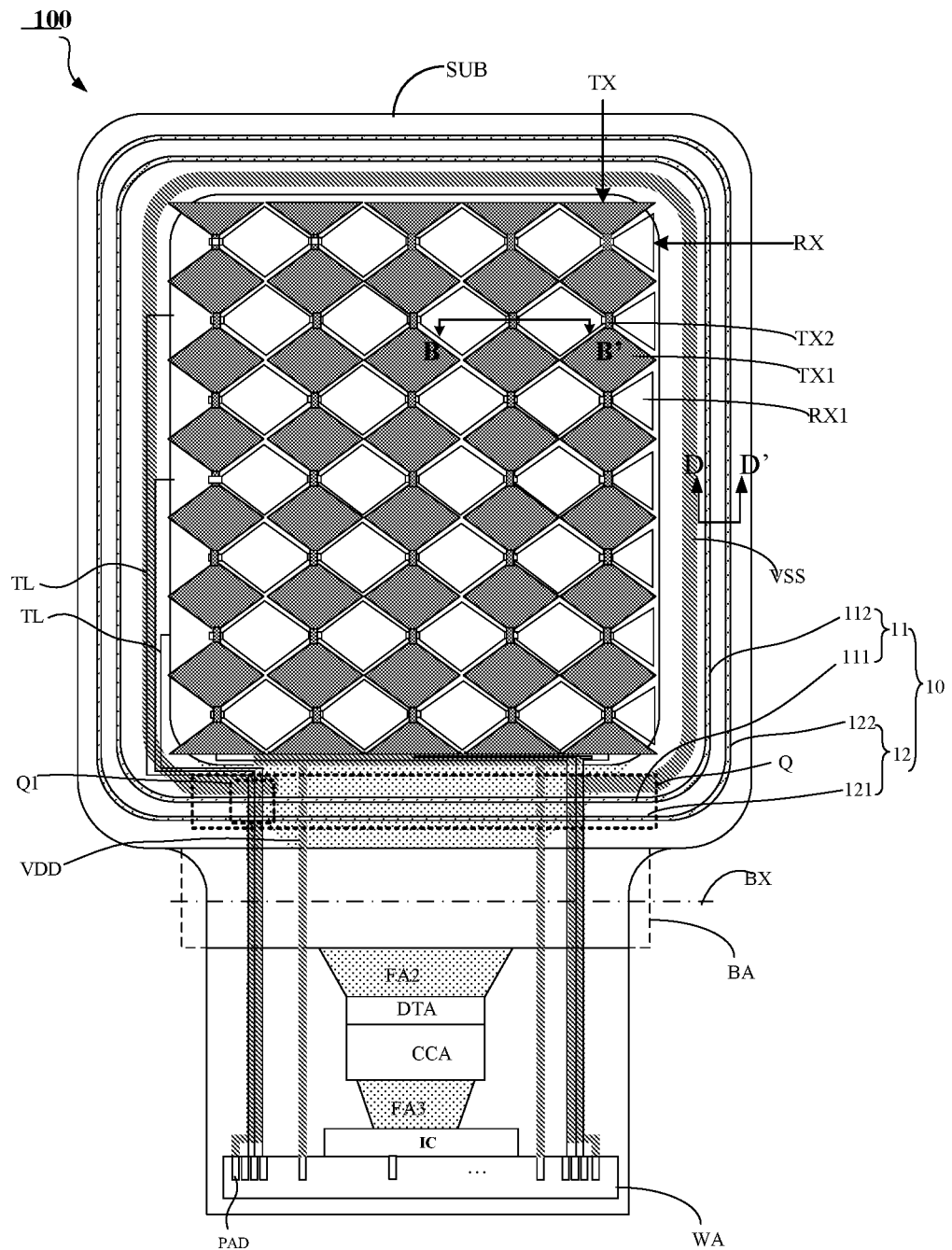
FIG. 2 is a schematic plan view of a display panel provided according to an embodiment of the present disclosure.
Figure 3:
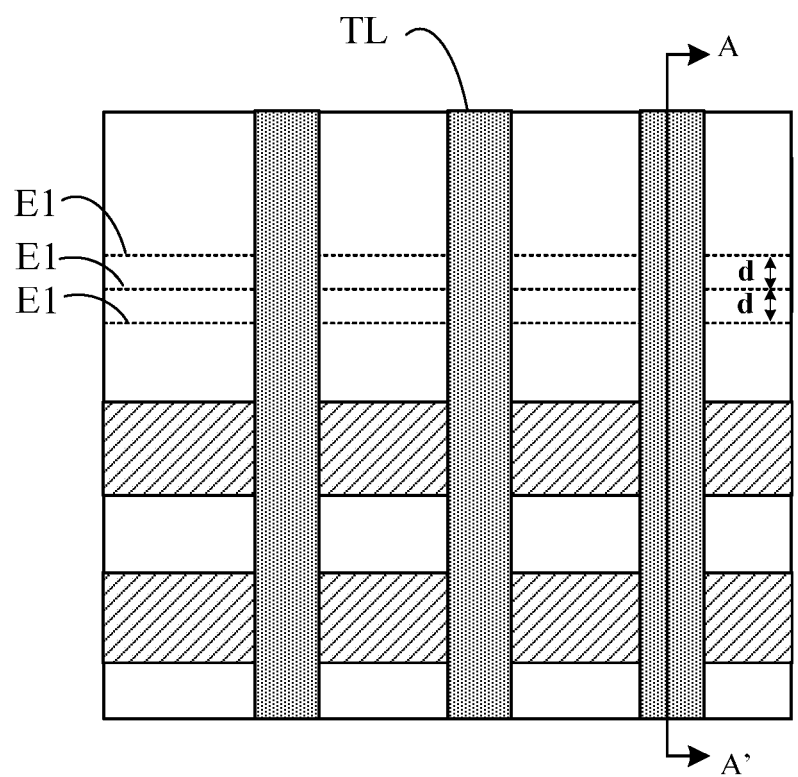
FIG. 3 is an enlarged view of an area Q1 in FIG. 2.
Figure 4:
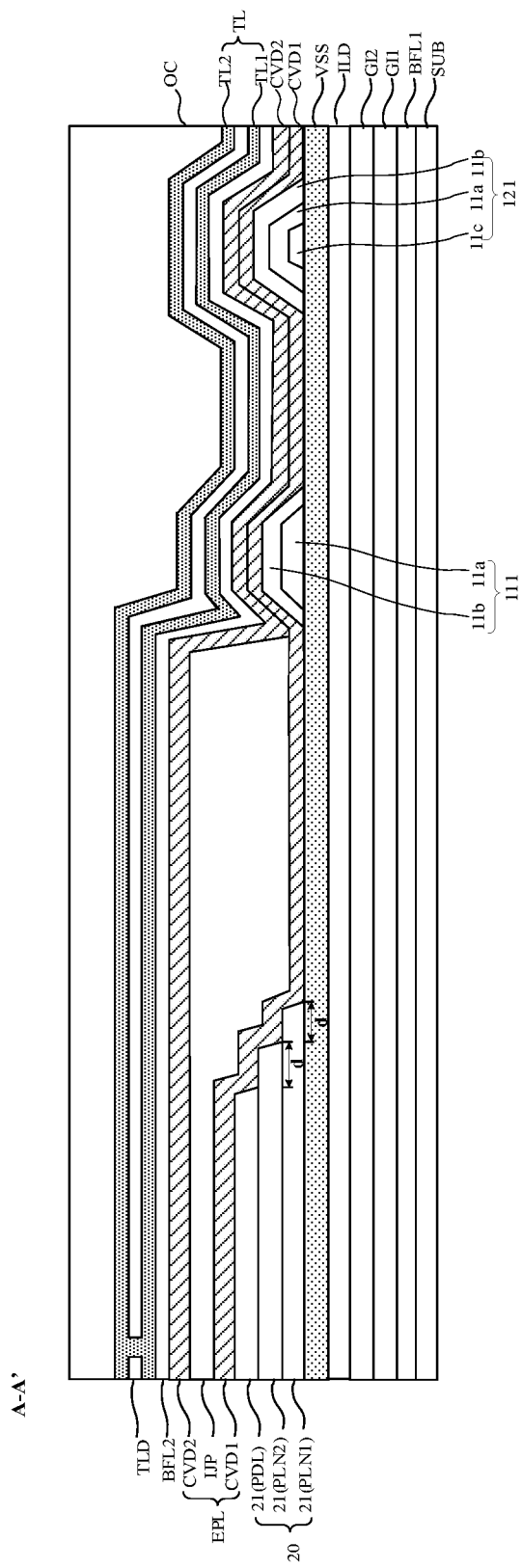
FIG. 4 is a cross-sectional view taken along line A-A' of FIG. 3.

FIG. 2 is a schematic plan view of a display panel according to an embodiment of the present disclosure, FIG. 3 is an enlarged view of an area Q1 in FIG. 2, and FIG. 4 is a cross-sectional view taken along A-A' line in FIG. 3, with reference to FIGS. 1 to 4, the display panel 100 further includes at least one barrier 10, an organic insulating structure 20, a touch electrode pattern, and a touch signal line TL.

The barrier 10 is disposed on the substrate SUB, and the barrier 10 is located in the peripheral area PA and surrounds the display area DA. The barrier 10 serves to block external moisture or oxygen from entering the display area DA, thereby preventing an influence on the display effect. The barrier 10 includes a single-sided barrier structure between the display area DA and the peripheral area PA. As a specific example, as shown in FIG. 2, the barrier 10 includes a first barrier 11 and a second barrier 12 surrounding the first barrier 11, the first barrier 11 includes a first barrier part 111 and a second barrier part 112 between the display area DA and the peripheral area PA, and the second barrier 12 includes a third barrier part 121 and a fourth barrier part 122 between the display area DA and the peripheral area PA, and at this time, the first barrier 111 and the third barrier 121 constitute the single-sided barrier structure.

The organic insulating structure 20 is disposed on the substrate SUB, the organic insulating structure 20 includes a plurality of sub-insulating structures 21 disposed in a stacked manner, a portion of each sub-insulating structure 21 is located in the display area DA, and another portion of each sub-insulating structure 21 is located in the peripheral area PA, for example, an orthographic projection of the sub-insulating structure 21 on the substrate SUB extends from the display area DA to between the display area DA and the barrier 10. Each of the sub-insulating structures 21 has a first boundary E1, and, for any two adjacent sub-insulating structures 21, the first boundary E1 of the sub-insulating structure 21 on a side away from the substrate SUB is closer to the display area DA than the first boundary E1 of the sub-insulating structure 21 on a side proximal to the substrate SUB, thereby forming a step shape (see FIG. 4). A distance d between first boundaries E1 of any two adjacent sub-insulating structures 21 is greater than or equal to 20 µm. It should be noted that, in order to clearly illustrate a position relationship between the first boundaries E1 of the sub-insulating structures 21, FIG. 3 only enlarges the area Q1 in FIG. 2, but it should be understood that each first boundary E1 is not only located in the area Q1 in FIG. 2, but corresponds to an entire lower edge of the display area DA in FIG. 2, that is, the first boundary E1 extends from a left end to a right end of an area Q in FIG. 2. Accordingly, the organic insulating structure 20 is formed as a step-like topography in FIG. 4 not only in the area Q1 but also in the entire area Q.

The touch electrode pattern is disposed on a side of the organic insulating structure 20 away from the substrate SUB. The touch electrode pattern is configured to detect occurrence of touch in the display area DA. For example, the touch electrode pattern includes a touch driving electrode TX and a touch sensing electrode RX shown in FIG. 2.

The touch signal line TL is disposed on a side of the organic insulating structure 20 away from the substrate SUB, and a terminal of the touch signal line TL is electrically coupled to the touch electrode pattern, and another terminal of the touch signal line TL is coupled to the welding area WA, so as to be electrically coupled to the contact pad in the welding area WA, where an orthographic projection of a portion of the touch signal line TL in the peripheral area PA on the substrate SUB intersects with the first boundary E1 of each sub-insulating structure 21.

When the distance d between the first boundaries E1 of any two adjacent sub-insulating structures 21 is relative small (e.g., d is less than or equal to 5 µm), the touch signal line TL is located on a steep slope, and in this case, when touch signal lines TL are formed by using an etching process, residues of conductive substances are easily generated between the touch signal lines TL, thereby causing a short-circuit between the touch signal lines TL. In the embodiment of the present disclosure, among the sub-insulating structures 21 of the organic insulating structure 20, the distance d between the first boundaries E1 of any two adjacent sub-insulating structures 21 is relative large, so that the touch signal lines TL are located on a gentle slope, which is beneficial to reduce residues of conductive substances between touch signal lines TL, and further reducing or preventing the short-circuit between the touch signal lines TL.

In some implementations, the distance d between the first boundaries E1 of any two adjacent sub-insulating structures 21 ranges from 25 µm to 60 µm, so as to narrow a bezel of the display panel 100 while reducing residues of conductive substances as much as possible. For example, d is 30 µm, or 35 µm, or 40 µm, or 45 µm, or 50 µm.

The display panel provided in the embodiment of the present disclosure is specifically described below with reference to FIGS. 1 to 8.

As shown in FIG. 2, the barrier 10 includes: a first barrier 11 and a second barrier 12. The first barrier 11 is positioned in the peripheral area PA and surrounds the display area DA. The second barrier 12 is positioned in the peripheral area PA and surrounds the first barrier 11, so that external moisture or oxygen may be further prevented from entering the display area DA, which provides a double protection to the display area DA. In some implementations, a vertical distance from an end of the first barrier 11 away from the substrate SUB to the substrate SUB is smaller than a vertical distance from an end of the second barrier 12 away from the substrate SUB to the substrate SUB, so as to extend a path for external moisture and oxygen to enter the display area DA, thereby improving a blocking capability of the barrier 10. The first barrier 11 includes a first barrier part 111 and a second barrier part 112, where the first barrier part 111 is located at a side of the display area DA proximal to a bending area (i.e., a portion of the first barrier 11 located below the display area DA and extending laterally in FIG. 2), the second barrier part 112 is a remaining portion of the first barrier 11 except the first barrier part 111, the second barrier 12 includes a third barrier part 121 and a fourth barrier part 122, the third barrier part 121 is located at a side of the display area DA proximal to the bending area (i.e., a portion of the second barrier 12 located below the display area DA and extending laterally in FIG. 2), and the fourth barrier part 122 is a remaining portion of the second barrier 12 except the third barrier part 121. The first barrier part 111 and the third barrier part 121 constitute the single-sided barrier structure described above.

In some implementations, the substrate SUB is a flexible substrate, which may be made of a flexible organic material. For example, the organic material is a resin material such as polyimide, polycarbonate, polyacrylate, polyetherimide, polyethersulfone, polyethylene terephthalate, or polyethylene naphthalate. The substrate SUB further includes a bending area BA located between the peripheral area PA and the welding area WA. The bending area BA is configured to bend along a bending axis BX. By bending the bending area BA, the welding area WA can be located at a back side of the display panel 100 (where a display side of the display panel 100 is a front side and a side opposite to the display side is the back side), so that a space utilization rate can be improved and a bezel width of a display product can be reduced.

Figure 6:
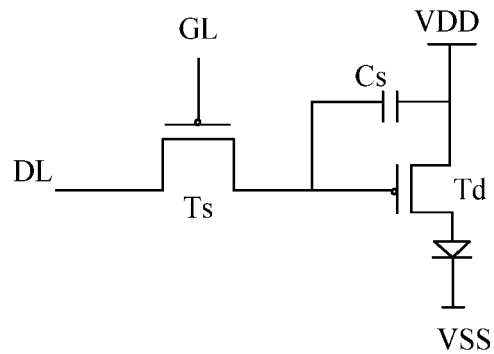
FIG. 6 is an equivalent schematic diagram of a pixel circuit according to an embodiment of the present disclosure.

In some implementations, the display area DA includes a plurality of pixel units P defined by intersections of scan lines GL and data lines DL. The scan lines GL are coupled to a gate driving circuit in the peripheral area PA, and each of the data lines DL may be coupled to the contact pads in the welding area WA through data coupling lines. A light emitting element 50 and a pixel circuit are provided in each pixel unit P. The light emitting element 50 may be an organic light emitting diode (OLED) which may emit, for example, red, green, blue or white light. FIG. 6 is an equivalent schematic diagram of a pixel circuit in an embodiment of the present disclosure, and as shown in FIG. 6, the pixel circuit includes: a driving transistor Td, a switching transistor Ts and a storage capacitor Cs, where a gate electrode of the switching transistor Ts is coupled to the scanning line GL, a first electrode of the switching transistor Ts is coupled to the data line DL, and a second electrode of the switching transistor Ts is coupled to a gate electrode of the driving transistor Td. Both terminals of the storage capacitor Cs are coupled to a first power supply line VDD and the gate electrode of the driving transistor Td, respectively. A first electrode of the driving transistor Td is coupled to the first power supply line VDD, a second electrode of the driving transistor Td is coupled to a first electrode of the light emitting element 50, and a second electrode of the light emitting element 50 is coupled to a second power supply line VSS. Each transistor in the embodiment may be a thin film transistor, a field effect transistor, or any other devices having the same characteristics. Since a source electrode and a drain electrode of the transistor are symmetrical, there is no difference between the source electrode and the drain electrode. To distinguish the source electrode and the drain electrode of the transistor, one of the source electrode and the drain electrode is referred to herein as the first electrode and the other one is referred to as the second electrode.

The first power supply line VDD is coupled from the welding area WA to the display area DA, thereby transmitting a voltage signal to each pixel unit. The second power supply line VSS includes a first portion and a second portion, where the first portion is located in the peripheral area PA and surrounds the display area DA in an open loop manner. The second portion of the second power supply line VSS is coupled between the first portion and the contact pad of the welding area WA. As shown in FIGS. 2 and 4, an orthogonal projection of the first boundary E1 of each sub-insulating structure 21 on the substrate SUB overlaps with an orthogonal projection of the second power supply line VSS on the substrate SUB.

Figure 7:
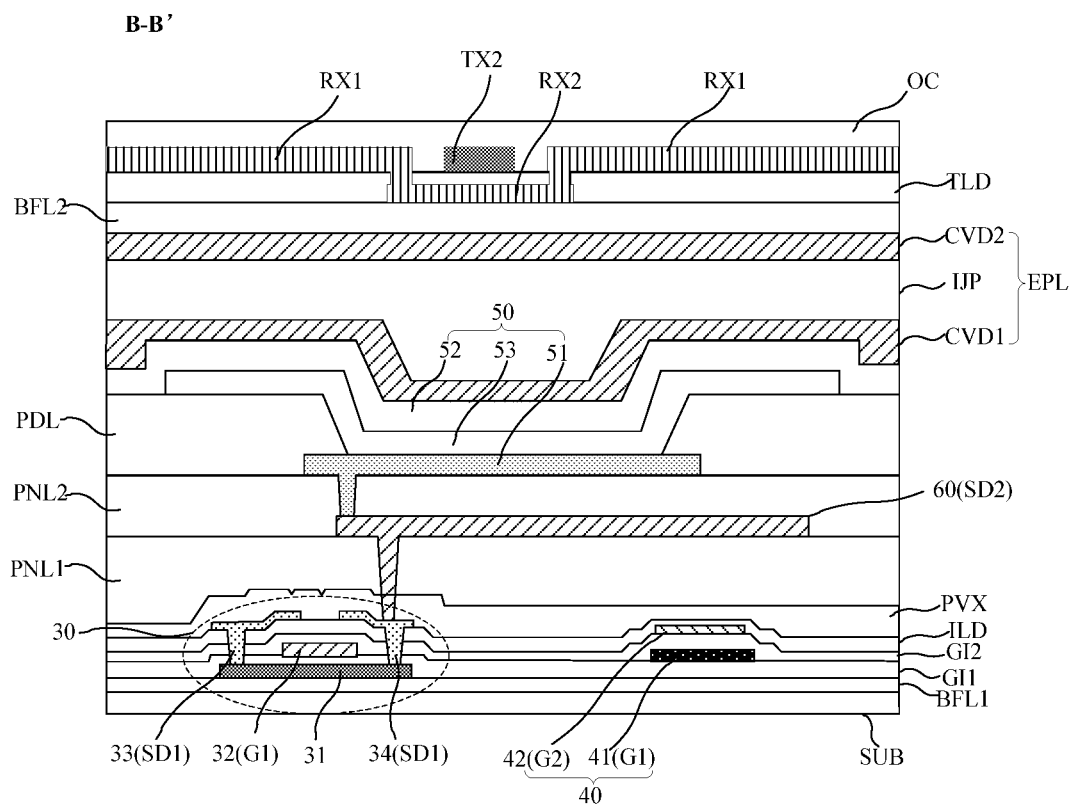
FIG. 7 is a cross-sectional view taken along line B-B' of FIG. 2.

In some implementations, the touch electrode pattern may adopt a mutual capacitance type structure, and may also adopt a self-capacitance type structure. The embodiment of the present disclosure is illustrated with the mutual capacitive structure as an example. As shown in FIG. 2, the touch electrode pattern includes a plurality of touch driving electrodes TX and a plurality of touch sensing electrodes RX, the touch driving electrodes TX and the touch sensing electrodes RX are arranged to intersect with each other, and the touch driving electrodes TX and the touch sensing electrodes RX are insulated and spaced from each other by a touch insulating layer TLD at intersection positions between the touch driving electrodes TX and the touch sensing electrodes RX. FIG. 7 is a cross-sectional view taken along line B-B' of FIG. 2, and in conjunction with FIGS. 2 and 7, the touch driving electrodes TX include: a plurality of driving electrode elements TX1 arranged along a first direction and coupling parts TX2 coupled between the driving electrode elements TX1, the touch sensing electrodes RX include a plurality of sensing electrode elements RX1 arranged along a second direction and bridge parts RX2 coupled between the sensing electrode elements RX1, where the first direction intersects with the second direction, for example, the first direction is an up-down direction in FIG. 2, and the second direction is a left-right direction in FIG. 2. The driving electrode elements TX1, the coupling parts TX2, and the sensing electrode elements RX1 are all located on a side of the touch insulating layer TLD away from the substrate SUB, the driving electrode elements TX1, the coupling parts TX2, and the sensing electrode elements RX1 may be disposed in a single layer, and the bridge parts RX2 are located on a side of the touch insulating layer TLD proximal to the substrate SUB. The bridge parts RX2 intersect with the coupling parts TX2 and they are spaced apart from each other by the touch insulating layer TLD. The sensing electrode element RX1 is coupled to the bridge part RX2 through a via hole in the touch insulating layer TLD. It should be noted that the touch driving electrodes TX and the touch sensing electrodes RX shown in FIG. 2 and FIG. 7 are only exemplary and do not limit the present disclosure. For example, the bridge parts RX2 may be located on a side of the touch insulating layer TLD away from the substrate SUB, and the coupling parts may be located on a side of the touch insulating layer TLD proximal to the substrate SUB. For another example, every adjacent ones of the driving electrode elements TX1 are coupled by the bridge parts provided in a layer different from that the driving electrode elements TX1 are located, and every adjacent ones of the sensing electrode elements RX1 are coupled by the coupling parts in a layer the same as that the sensing electrode elements RX1 are located.

Each of the touch driving electrodes TX and each of the touch sensing electrodes RX each may be correspondingly coupled to one touch driving line TL. When the touch signal line TL passes through the peripheral area PA, an orthogonal projection of a portion, in the peripheral area PA, of the touch signal line TL on the substrate SUB intersects with the first boundary E1 of each sub-insulating structure 21. In an example, the touch insulation layer TLD further covers at least a portion of the peripheral area PA between the display area DA and the welding area WA, and the touch signal line TL in the portion of the peripheral area PA between the display area DA and the welding area WA is located on the touch insulation layer TLD. In an example, a thickness of the touch insulating layer TLD ranges from 0.2 μm to 0.5 μm, such as 0.3 μm or 0.33 μm or 0.35 μm.

In some implementations, as shown in FIG. 4, the touch signal line TL has a double-layer structure and includes a first transmission portion TL1 and a second transmission portion TL2, the first transmission portion TL1 is located on a side of the touch insulating layer TLD proximal to the substrate SUB, and the second transmission portion TL2 is located on a side of the touch insulating layer TLD away from the substrate SUB. The second transmission portion TL2 is electrically coupled to the first transmission portion TL1 through a via hole penetrating through the touch insulation layer TLD. Note that, FIG. 4 only illustrates one via hole in order to schematically illustrate a coupling manner between the second transmission portion TL2 and the first transmission portion TL1, but actually, a plurality of via holes may be provided at other positions so that the second transmission portion TL2 is coupled in parallel with the first transmission portion TL1 through the plurality of via holes. The first transmission portion TL1 may be disposed in the same layer as the bridge parts RX2, and the second transmission portion TL2 may be disposed in the same layer as the driving electrode elements TX1, the coupling parts TX2, and the sensing electrode elements RX 1.

As shown in FIG. 7, a first buffer layer BFL1 is disposed on the substrate SUB for preventing or reducing diffusion of metal atoms and/or impurities from the substrate SUB into an active layer of the transistor. In the embodiment of the present disclosure, the first buffer layer BFL1 may expose an upper surface of a portion of the substrate SUB located in the bending area BA to facilitate bending of the substrate SUB. For example, the first buffer layer BFL1 may include an inorganic material such as silicon oxide (SiOx), silicon nitride (SiNx), and/or silicon oxynitride (SiON), and may be formed as a single-layer or multi-layer structure.

A semiconductor layer is disposed on the first buffer layer BFL1. A material of the semiconductor layer may include, for example, an inorganic semiconductor material (e.g., polycrystalline silicon, amorphous silicon, or the like), an organic semiconductor material, an oxide semiconductor material. The semiconductor layer includes an active layer 31 of each transistor 30, the active layer 31 including a channel portion and source and drain coupling portions on both sides of the channel portion, the source coupling portion being coupled to a source electrode 33 of the transistor 30, and the drain coupling portion being coupled to a drain electrode 34 of the transistor 30. Each of the source coupling portion and the drain coupling portion may be doped with an impurity (e.g., an N-type impurity or a P-type impurity) having a higher impurity concentration than that of the channel portion. The channel portion faces the gate electrode 32 of the transistor 30, and when a voltage signal applied to the gate electrode 32 reaches a predetermined value, a carrier path is formed in the channel portion, and the source electrode 33 and the drain electrode 34 of the transistor 30 are electrically coupled to each other, that is, the transistor 30 is turned on.

A first gate insulating layer GI1 is disposed on the semiconductor layer, where the first gate insulating layer GI1 may expose an upper surface of a portion of the substrate SUB located in the bending area BA to facilitate bending of the substrate SUB. A material of the first gate insulating layer GI1 may include a silicon compound and a metal oxide. For example, the material of the first gate insulating layer GI1 includes silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), and the like. In addition, the first gate insulating layer GI1 may be a single-layer or multi-layer structure.

A first gate electrode layer G1 is disposed on the first gate insulating layer GI1. The first gate electrode layer G1 includes the gate electrode 32 of each transistor 30 and a first electrode 41 of a capacitor 40. A material of the first gate electrode layer G1 may include, for example, a metal alloy, a metal nitride, a conductive metal oxide, a transparent conductive material, or the like. For example, the first gate electrode layer G1 may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiN x), platinum (Pt), tantalum (Ta), tantalum nitride (TaNx), neodymium (Nd), scandium (Sc), strontium ruthenium oxide (SRO), zinc oxide (ZnOx), TiN oxide (SnOx), indium oxide (InOx), gallium oxide (GaOx), indium tin oxide (ITO), indium zinc oxide (IZO), or the like. The first gate electrode layer G1 may have a single-layer or multi-layer structure.

As shown in FIG. 7, a second gate insulating layer GI2 is disposed on the first gate electrode layer G1, and the second gate insulating layer GI2 may expose an upper surface of a portion of the substrate SUB in the bending area BA. A material of the second gate insulating layer GI2 may include, for example, a silicon compound or a metal oxide. For example, the material of the second gate insulating layer GI2 may include silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), and the like. The second gate insulating layer GI2 may be formed as a single-layer or multi-layer structure.

As shown in FIG. 7, a second gate electrode layer G2 is disposed on the second gate insulating layer GI2. The second gate electrode layer G2 may include a second electrode 42 of the capacitor 40. A material of the second gate electrode layer G2 may include, for example, a metal alloy, a metal nitride, a conductive metal oxide, a transparent conductive material, or the like. For example, the gate electrode layer may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), tin oxide (SnOx), indium oxide (InOx), gallium oxide (GaOx), indium tin oxide (ITO), indium zinc oxide (IZO), or the like. The second gate electrode layer G2 may have a single-layer or multi-layer structure.

As shown in FIG. 7, an interlayer insulating layer ILD, which may expose an upper surface of a portion of the substrate SUB located in the bending area BA, is disposed on the second gate electrode layer G2. A material of the interlayer insulating layer ILD may include, for example, a silicon compound, a metal oxide, and the like. In particular, the silicon compound and the metal oxide may be selected from those listed above and will not be described in detail here.

A first source-drain conductive layer SD1 is disposed on the interlayer insulating layer ILD. The first source-drain conductive layer SD1 may include a source electrode 33 and a drain electrode 34 of each transistor in the display area DA, the source electrode 33 being electrically coupled to the source coupling portion, the drain electrode 34 being electrically coupled to the drain coupling portion. The first source-drain conductive layer SD1 may include a metal, an alloy, a metal nitride, a conductive metal oxide, a transparent conductive material, etc., for example, the first source-drain conductive layer SD1 may be a single-layer or multi-layer structure of a metal, such as Mo/Al/Mo or Ti/Al/Ti. The transistor 30 shown in FIG. 7 includes the gate electrode 32, the source electrode 33, the drain electrode 34 and the active layer 31, and the transistor 30 shown in FIG. 7 may be the driving transistor Td of the pixel circuit shown in FIG. 6, but it should be noted that when the pixel circuit adopts other circuit structure, the driving transistor Td is not necessarily directly coupled to the light emitting element 50, and at this time, the driving transistor Td is not necessarily corresponding to the transistor shown in FIG. 7. In addition, the first source-drain conductive layer SD1 may further include a first power supply line VDD and a second power supply line VSS.

A passivation layer PVX is disposed on the first source-drain conductive layer SD1, and the passivation layer PVX may expose a surface of a portion of the substrate SUB in the bending area BA. A material of the passivation layer PVX may include a compound of silicon, for example, silicon oxide, silicon nitride, or silicon oxynitride.

In some implementations, as shown in FIG. 4, the sub-insulating structures 21 of the organic insulating structure 20 include: a first planarization layer PLN1, a second planarization layer PLN2, and a pixel defining layer PDL. The first planarization layer PLN1, the second planarization layer PLN2, and the pixel defining layer PDL each include a portion located in the display area DA and a portion located between the display area DA and the barrier 10. The second planarization layer PLN2 is located on a side of the first planarization layer PLN1 away from the substrate SUB. The pixel defining layer PDL is located on a side of the second planarization layer PLN2 away from the substrate SUB. The first buffer layer BFL1, the semiconductor layer, the first gate insulating layer GI1, the first gate electrode layer G1, the second gate insulating layer GI2, the second gate electrode layer G2, the interlayer insulating layer ILD, the first source-drain conductive layer SD1, and the passivation layer PVX are all located between the first planarization layer PLN1 and the substrate SUB. A surface of the first planarization layer PLN1 away from the substrate SUB is substantially flat. The first planarization layer PLN1 is made of an organic insulating material, for example, the organic insulating material includes resin materials such as polyimide, epoxy resin, acryl, polyester, photoresist, polyacrylate, polyamide, and siloxane. As another example, the organic insulating material includes an elastic material, such as urethane, Thermoplastic Polyurethane (TPU), or the like.

In an example, the first planarization layer PLN1 and the second planarization layer PLN2 each have a thickness between 1 μm and 2 μm, e.g., the first planarization layer PLN1 and the second planarization layers PLN2 each have a thickness of 1.6 μm. A thickness of the pixel defining layer PDL is between 1.5 μm and 3 μm, for example, is 2 μm.

As shown in FIG. 7, a second source-drain conductive layer SD2 is disposed on the first planarization layer PLN 1. The second source-drain conductive layer SD2 may include a transfer electrode 60 positioned within the display area DA, where the transfer electrode 60 is electrically coupled to the drain electrode 34 through a via hole penetrating through the first planarization layer PLN1 and the passivation layer PVX, and simultaneously, the transfer electrode 60 is also electrically coupled to the first electrode 51 of the light emitting element 50 through a via hole penetrating through the second planarization layer PLN 2. The transfer electrode 60 can prevent a formation of a via hole having a relatively large aperture directly in the first planarization layer PLN1 and the second planarization layer PLN2, thereby improving a quality of an electrical coupling through the via hole. A material of the second source-drain conductive layer SD2 may include metal, alloy, metal nitride, conductive metal oxide, transparent conductive material, or the like, for example, the second source-drain conductive layer SD2 may be a single-layer or multi-layer structure made of metal, such as Mo/Al/Mo or Ti/Al/Ti. The material of the second source-drain conductive layer SD2 may be the same as or different from the material of the first source-drain conductive layer SD 1.

As shown in FIG. 7, a second planarization layer PLN2 is disposed on the second source-drain conductive layer SD2, the second planarization layer PLN2 covers the transfer electrode, and an upper surface of the second planarization layer PLN2 is substantially flat. The second planarization layer PLN2 is made of an organic insulating material, for example, the organic insulating material includes resin materials such as polyimide, epoxy resin, acryl, polyester, photoresist, polyacrylate, polyamide, and siloxane. As another example, the organic insulating material includes an elastic material, such as urethane, Thermoplastic Polyurethane (TPU), or the like. The material of the second planarization layer PLN2 may be the same as or different from the material of the first planarization layer PLN1.

A first electrode layer is disposed on the second planarization layer PLN2, where the first electrode layer includes a plurality of first electrodes, which may be anodes of light emitting elements 50. As shown in FIG. 7, the light emitting element 50 includes a first electrode 51, a light emitting layer 53, and a second electrode 52, the first electrode 51 being disposed on the second planarization layer PLN2. The first electrode 51 is electrically coupled to the transit electrode 60, and thus to the drain electrode 34 of the transistor 30, through a via hole penetrating through the second planarization layer PLN2. The first electrode 51 may be made of a material such as a metal, a metal alloy, a metal nitride, a conductive metal oxide, a transparent conductive material, or the like. The first electrode 51 may have a single-layer or multi-layer structure.

The pixel defining layer PDL is disposed on the second planarization layer PLN2. The pixel defining layer PDL includes pixel openings in one-to-one correspondence with the pixel units, and each of the pixel openings exposes a portion of the first electrode 51 corresponding thereto. Light emitting layers 54 are disposed in the pixel openings in a one-to-one correspondence mode, and the light emitting layers 54 may include a small molecule organic material or a polymer molecule organic material, such as a fluorescent light emitting material or a phosphorescent light emitting material, may emit red light, green light, blue light, or may emit white light. A material of the pixel defining layer PDL may include an organic insulating material such as polyimide, polyphthalamide, acrylic resin, benzocyclobutene, or phenol resin. In addition, spacers (not shown in FIG. 7) may be further disposed on the pixel defining layer PDL, and a material of the spacers may be the same as that of the pixel defining layer PDL.

The second electrode 52 is located on a side of the light emitting layer 53 away from the substrate SUB, and the second electrode 52 may be made of metal, metal alloy, metal nitride, conductive metal oxide, transparent conductive material, or the like. In the embodiment of the present disclosure, the light emitting element 50 may employ a top emission type structure or a bottom emission type structure. When the top emission type structure is employed, the first electrode 51 includes a conductive material having a light reflection property or includes a light reflection film, and the second electrode 52 includes a transparent or translucent conductive material. When the bottom emission type structure is employed, the second electrode 52 includes a conductive material having a light reflection property or includes a light reflection film, and the first electrode 51 includes a transparent or translucent conductive material. Second electrodes 52 of light emitting elements 50 of the respective pixel units may be integrally coupled to form a second electrode layer.

It should be noted that the light emitting element 50 may further include other film layers, for example, further include: a hole injection layer and a hole transport layer between the first electrode 51 and the light emitting layer 53, and an electron transport layer and an electron injection layer between the light emitting layer 53 and the second electrode 52.

As shown in FIGS. 4 and 7, the display panel 100 further includes an encapsulation layer EPL disposed on the pixel defining layer PDL, and the encapsulation layer EPL covers the pixel defining layer PDL and the light emitting element 50 to encapsulate the light emitting element 50, so as to prevent moisture and/or oxygen in the external environment from corroding the light emitting element 50. In some implementations, the encapsulation layer EPL includes a first inorganic encapsulation layer CVD1, a second inorganic encapsulation layer CVD2, and an organic encapsulation layer IJP, the second inorganic encapsulation layer CVD2 being located on a side of the first inorganic encapsulation layer CVD1 away from the substrate SUB, the organic encapsulation layer IJP being located between the first inorganic encapsulation layer CVD1 and the second inorganic encapsulation layer CVD2. In some implementations, the first inorganic encapsulation layer CVD1 and the second inorganic encapsulation layer CVD2 extend to the peripheral area PA and cover the barrier 10; the organic encapsulation layer IJP extends to the peripheral area PA and is located within a range surrounded by the barrier 10. The first inorganic encapsulation layer CVD1 and the second inorganic encapsulation layer CVD2 may be made of inorganic materials with high compactness, such as silicon oxynitride (SiON), silicon oxide (SiOx), and silicon nitride (SiNx). The organic encapsulation layer IJP may be made of a polymer material containing a desiccant or a polymer material capable of blocking water vapor. For example, a polymer resin is used, so that a stress of the first inorganic encapsulation layer CVD1 and the second inorganic encapsulation layer CVD2 can be relieved, and a water-absorbing material such as a desiccant can be included to absorb substances such as water, oxygen and the like which intrude inside.

In an example, the first inorganic encapsulation layer CVD1 and the second inorganic encapsulation layer CVD2 each have a thickness between 0.5 µm and 1.5 µm. For example, the thickness of the first inorganic encapsulation layer CVD1 is 1.0 µm, and the thickness of the second inorganic encapsulation layer CVD2 is 0.6 µm. The thickness of the organic encapsulation layer IJP in the display area DA is between 5 µm and 10 µm, for example, is 8 µm, or 7 µm, or 9 µm.

The second buffer layer BFL2 is disposed on the encapsulation layer EPL, and the second buffer layer BFL2 is positioned in the display area DA and extends to the peripheral area PA to cover the encapsulation layer EPL. The second buffer layer BFL2 may use the same material as the first buffer layer BFL1 aforementioned, and thus, will not be described again. The touch electrode pattern is located on a side of the encapsulation layer EPL away from the substrate SUB, the bridge parts RX2 of the touch electrode pattern are arranged on the encapsulation layer EPL, the touch insulating layer TLD is located on a side of the encapsulation layer EPL away from the substrate SUB, and covers the bridge parts RX2, and the sensing electrode elements RX1 of the touch driving electrode TX and the touch sensing electrode RX are located on the touch insulating layer TLD. In order not to affect display, the driving electrode elements TX1 and the sensing electrode elements RX1 each have a structure with good light transmittance, for example, are made of a transparent conductive material (e.g., indium tin oxide) or adopt a metal mesh structure.

The touch electrode pattern and the touch insulating layer TLD are both located on a side of the encapsulation layer EPL away from the substrate SUB, and the bridge parts RX2 in the touch electrode pattern is located between the touch insulating layer TLD and the encapsulation layer EPL. The bridge parts RX2 and the first transmission portion TL1 are both located between the touch insulating layer TLD and the second buffer layer BFL2.

Figure 5:
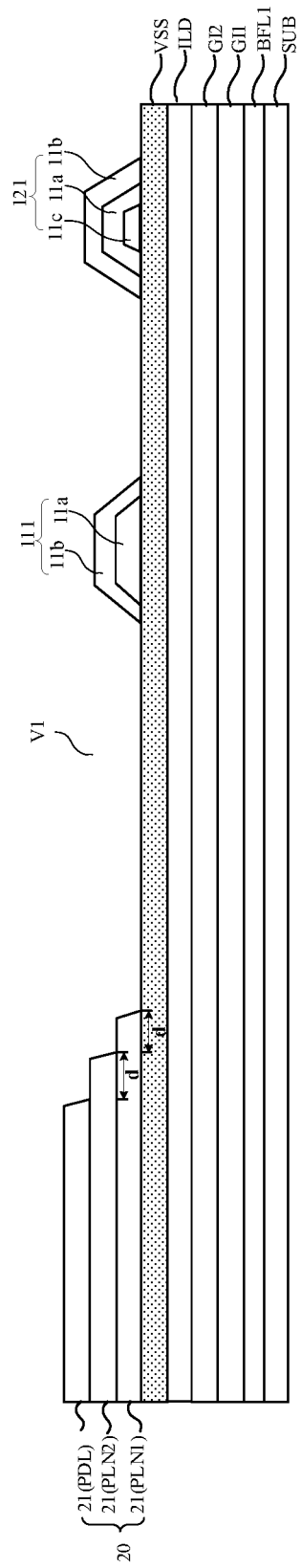
FIG. 5 is a schematic diagram of a recess between an organic insulating structure and a single-sided barrier structure according to an embodiment of the present disclosure.

As shown in FIG. 4, a space exists between the first boundary of each sub-insulating structure 21 and the single-sided barrier structure, that is, each sub-insulating structure 21 does not contact the single-sided barrier structure. At this time, a recess is formed between the organic insulating structure 20 and the single-sided barrier structure, FIG. 5 is a schematic diagram of a recess between the organic insulating structure and the single-sided barrier structure in the embodiment of the present disclosure, and FIG. 5 is a cross-sectional view taken along line A-A' in FIG. 3 after the organic insulating structure 20 and the barrier 10 are formed and before the encapsulation layer EPL is formed. As shown in FIGS. 4 and 5, an orthographic projection of the encapsulation layer EPL on the substrate SUB covers an orthographic projection of the organic insulating structure 20 on the substrate SUB, an orthographic projection of the recess V1 on the substrate SUB, and an orthographic projection of the single-sided barrier structure on the substrate SUB at the same time.

An upper cover layer OC is arranged on a side of the touch electrode pattern away from the substrate SUB. The upper cover layer OC extends from the display area DA to the peripheral area PA, and may protect the touch signal line TL in the peripheral area PA. A material of the upper cover layer OC may include an inorganic insulating material or an organic insulating material.

The flexible substrate SUB of the embodiment of the present disclosure is provided with the first gate insulating layer GI1, the second gate insulating layer G12, the first buffer layer BFL1, and the second buffer layer BFL2, however, it is understood that, in some examples, these layers may be deleted or added according to actual needs, which is not specifically limited by the present disclosure.

Figure 8:
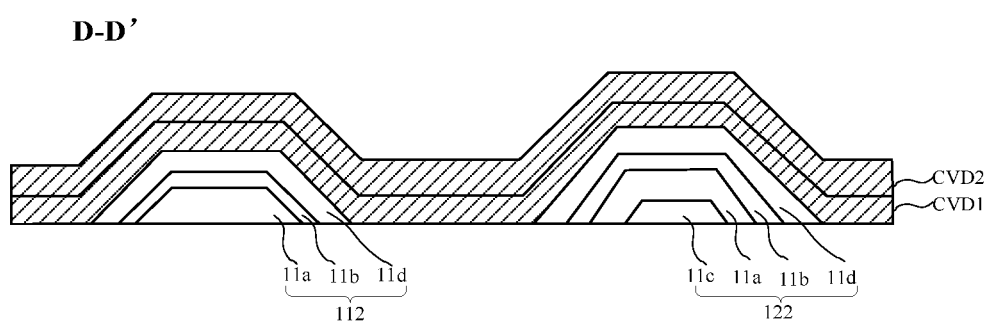
FIG. 8 is a cross-sectional view taken along line D-D' of FIG. 2.

FIG. 8 is a cross-sectional view taken along line D-D' in FIG. 2, in which in order to illustrate a structure of the barrier 10 for simplicity and clarity, FIG. 8 shows only a cross-sectional structure of the barrier 10 and the first inorganic encapsulation layer and the second inorganic encapsulation layer on the barrier 10. As shown in FIGS. 2, 4 and 8, each of the first barrier part 111, the second barrier part 112, the third barrier part 121 and the fourth barrier part 122 includes a first barrier layer 11a and a second barrier layer 11b on the first barrier layer 11a, where the first barrier layer 11a and the second planarization layer PLN2 are disposed in a single layer and have a same material, and the second barrier layer 11b and the pixel defining layer PDL are disposed in a single layer and have a same material. In addition, as shown in FIG. 4, the third barrier part 121 further includes a third barrier layer 11c, and the third barrier layer 11c and the first planarization layer PLN1 are disposed in a single layer and have a same material. As shown in FIG. 8, the second barrier part 112 includes the first barrier layer 11a, the second barrier layer 11b, and a fourth barrier layer 11d, and the fourth barrier layer 11d and the spacers on the pixel defining layer PDL are disposed in a single layer and have a same material. The fourth barrier part 122 includes the first barrier layer 11a, the second barrier layer 11b, a third barrier layer 11c, and the fourth barrier layer 11d.

It should be noted that "disposed in a single layer" in the embodiment of the present disclosure means that two structures are formed by a same material layer through a patterning process, and therefore, the two structures are located in the same layer in a layer-to-layer relationship, which does not mean that distances between one of the two structures and the substrate SUB and between the other of the two structures and the substrate SUB must be the same. In addition, as shown in FIGS. 5 and 8, the first inorganic encapsulation layer CVD1 and the second inorganic encapsulation layer CVD2 in the encapsulation layer EPL each extend onto the first barrier 11 and the second barrier 12.

In some implementations, the peripheral area PA of the substrate SUB includes a first fan-out area FA1, the first fan-out area FA1 is located between the display area DA and the bending area BA, and the data coupling line is coupled to the data line DL and then extends to the welding area WA passing through the first fan-out area FA1 and the bending area BA. The substrate SUB further includes a second fan-out area FA2, the second fan-out area FA2 being located between the bending area BA and the welding area WA and adjoining the bending area BA, i.e., the second fan-out area FA2 is adjacent to and directly coupled to the bending area BA, no other area exists between the second fan-out area FA2 and the bending area BA. A test area DTA, a control circuit area CCA, a third fan-out area FA3 and an integrated circuit area IC are further arranged between the second fan-out area and the welding area WA of the substrate SUB. In at least one example, the test area DTA is configured to be coupled to an external test device to detect a screen, a broken line of the bending area BA, and the like. In at least one example, the control circuit area CCA includes a selector MUX to switch between an input circuit and an output circuit.

Another embodiment of the present disclosure provides a display panel including: a substrate, a barrier, an organic insulating structure, a touch control electrode pattern and a touch control signal line, where the substrate includes: a display area, a peripheral area and a welding area, the peripheral area surrounds the display area, and the welding area is positioned on a side of the peripheral area away from the display area. The barrier is disposed on the substrate, the barrier being in the peripheral area and surrounding the display area, the barrier including a single-sided barrier structure between the display area and the welding area. The organic insulating structure is arranged on the substrate, and a portion of the organic insulating structure is located in the display area, and another portion of the organic insulating structure is located in the peripheral area.

Figure 9:
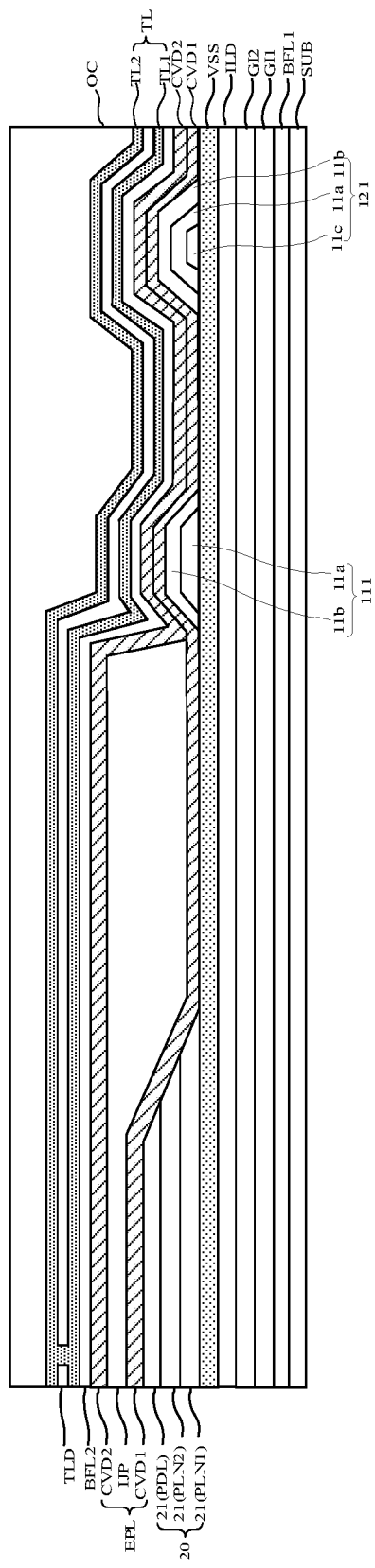
FIG. 9 is a cross-sectional view taken along line A-A' of FIG. 3 according to an embodiment of the present disclosure.
Figure 10:
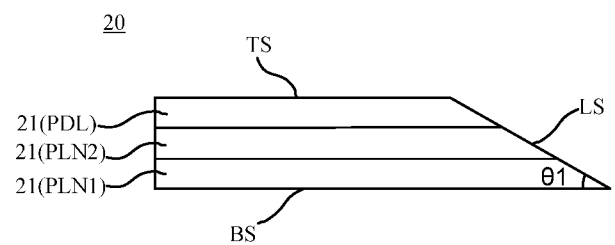
FIG. 10 is a schematic structural diagram of the organic insulating structure in FIG. 9.
Figure 11:
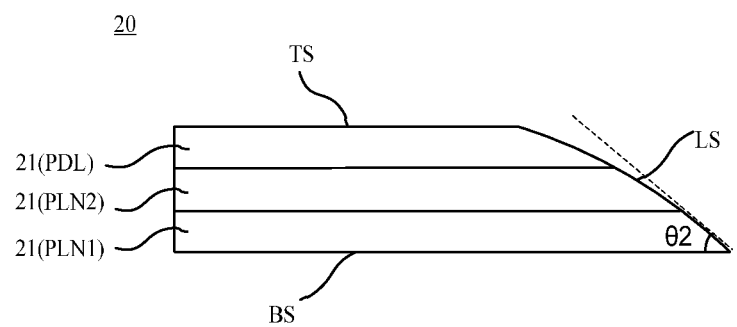
FIG. 11 is a schematic structural diagram of the organic insulating structure in FIG. 9.

FIG. 9 is a cross-sectional view taken along line A-A' in FIG. 3 according to an embodiment of the present disclosure, FIG. 10 is a structural diagram of the organic insulating structure in FIG. 9, and FIG. 11 is another structural diagram of the organic insulating structure in FIG. 9. As shown in FIGS. 2 and 9 to 11, the organic insulating structure 20 has a bottom surface BS facing the substrate SUB, a top surface TS opposite to the bottom surface BS, and a first side surface LS coupled between the bottom surface BS and the top surface TS and facing the single-sided barrier structure, where the first side surface LS is a slope surface, and a slope angle of the slope surface ranges from 0° to 40°.

Here, the "slope surface" refers to a surface gradually approaching the display area DA in a direction away from the substrate SUB. The slope surface may be an inclined plane (as shown in FIG. 10) or an inclined arc surface (as shown in FIG. 11). When the slope surface is a plane, the slope angle refers to an included angle θ1 between the slope surface and the bottom surface BS of the organic insulating structure 20; when the slope surface is an arc surface, the slope angle refers to a maximum value θ2 of an included angle between a tangent of the arc surface and the bottom surface BS of the organic insulating structure 20. It should be noted that the slope surface is not only located in the Q1 area, but extends from a left end to a right end of the Q area.

As shown in FIGS. 2 and 9, the touch electrode pattern (i.e., the pattern including the touch driving electrodes TX and the touch sensing electrodes RX in FIG. 2) is disposed on a side of the organic insulating structure 20 away from the substrate SUB. The touch signal line TL is disposed on a side of the organic insulating structure 20 away from the substrate SUB, and a terminal of the touch signal line TL is electrically coupled to the touch electrode pattern and another terminal of the touch signal line TL is coupled to the welding area WA. An orthographic projection of a portion of the touch signal line TL in the peripheral area PA on the substrate SUB passes through an orthographic projection of the slope surface on the substrate SUB.

In some implementations, the slope angle of the slope surface is between 25° and 35°, so that a bezel of a display product is prevented from being too wide while residues of conductive substances are reduced. For example, the slope angle may be 28° or 29° or 30° or 31° or 32°.

As shown in FIG. 9, the organic insulating structure 20 includes a plurality of sub-insulating structures 21 arranged in a stacked manner, and the sub-insulating structures 21 include: a first planarization layer PLN1, a second planarization layer PLN2, and a pixel defining layer PDL. The first planarization layer PLN1 is disposed on the substrate SUB. The second planarization layer PLN2 is located on a side of the first planarization layer PLN1 away from the substrate SUB. The pixel defining layer PDL is located on a side of the second planarization layer PLN2 away from the substrate SUB.

An encapsulation layer EPL, a second buffer layer BFL2, and a touch insulating layer TLD are further provided on the organic insulating structure 20. The encapsulation layer EPL includes a first inorganic encapsulation layer CVD1, a second inorganic encapsulation layer CVD2, and an organic encapsulation layer IJP. The second inorganic encapsulation layer CVD2 is located on a side of the first inorganic encapsulation layer CVD1 away from the substrate SUB; the organic encapsulation layer IJP is located between the first inorganic encapsulation layer CVD1 and the second inorganic encapsulation layer CVD2.

In the present embodiment, the touch insulating layer TLD and the touch signal line TL are arranged in the manner as described in the above embodiment, as shown in FIG. 2 and FIG. 7, the touch electrode pattern includes touch driving electrodes TX and touch sensing electrodes RX, the touch driving electrodes TX intersect with the touch sensing electrodes RX, and the touch driving electrodes TX and the touch sensing electrodes RX are insulated and spaced from each other by the touch insulating layer TLD at intersection positions between the touch driving electrodes TX and the touch sensing electrodes RX. Each of the touch driving electrode TX and the touch sensing electrode RX is electrically coupled to one touch signal line TL. The touch signal line TL includes a first transmission portion TL1 and a second transmission portion TL2, the first transmission portion TL1 is located between the touch insulating layer TLD and the encapsulation layer EPL, the second transmission portion TL2 is located on a side of the touch insulating layer TLD away from the substrate SUB, and the second transmission portion TL2 is electrically coupled to the first transmission portion TL1 through a via hole penetrating through the touch insulating layer TLD. The touch electrode pattern and the touch signal line TL are both located on a side of the encapsulation layer EPL away from the substrate SUB.

A space exists between the first side surface LS and the single-sided barrier structure, for example, a space is provided between an end of the first side surface LS proximal to the substrate SUB and the single-sided barrier structure, and a space is provided between an end of the first side surface LS away from the substrate SUB and the single-sided barrier structure. A recess is formed between the organic insulating structure 20 and the single-sided barrier structure, and an orthographic projection of the encapsulation layer EPL on the substrate SUB covers an orthographic projection of the organic insulating structure 20 on the substrate SUB, an orthographic projection of the recess on the substrate SUB and an orthographic projection of the single-sided barrier structure on the substrate SUB at the same time, and the single-sided barrier structure is located between the substrate SUB and the encapsulation layer EPL.

The display area DA includes a plurality of pixel units, each pixel unit has a light emitting element 50 disposed therein, and the display panel 100 further includes a second power supply line VSS electrically coupled to the light emitting element 50, where the second power supply line VSS is located between the organic insulating structure 20 and the substrate SUB, and an orthographic projection of the first side surface LS on the substrate SUB overlaps with an orthographic projection of the second power supply line VSS on the substrate SUB.

The barrier 10 includes a first barrier 11 and a second barrier 12, the first barrier 11 being located in the peripheral area PA and surrounding the display area DA, and the second barrier 12 being located in the peripheral area PA and surrounding the first barrier 11. The specific structures of the first barrier 11 and the second barrier 12 are described in the above embodiment, and will not be described in detail here. The substrate SUB is further provided with structures such as a first buffer layer BFL1, a semiconductor layer, a first gate insulating layer GI1, a first gate electrode layer G1, a second gate insulating layer GI2, an interlayer insulating layer ILD, a first source-drain conductive layer SD1, a passivation layer PVX, and a second source-drain conductive layer SD2, and structures and positions of such layers are described in the above embodiment, which are not described herein again. The substrate SUB in the embodiment is a flexible substrate, and further includes a bending area BA between the peripheral area PA and the welding area WA, and further includes other areas such as a test area DTA and a control circuit area CCA, and a positional relationship between such areas is described in the above embodiment, and is not described again here.

In the display panel of the embodiment, the first side surface of the organic insulating structure 20 is a slope surface, and the slope of the slope surface is relatively small, so that when touch signal lines are manufactured by subsequent etching processes, residues of conductive substances can be reduced, and a short-circuit between the touch signal lines TL can be reduced or prevented.

An embodiment of the present disclosure further provides a display panel, which includes a substrate, a barrier, an organic insulating structure, a touch electrode pattern, and a touch signal line. The substrate includes: a display area, a peripheral area and a welding area, where the peripheral area surrounds the display area, and the welding area is positioned on a side of the peripheral area away from the display area. The barrier is disposed on the substrate, the barrier is in the peripheral area and surrounds the display area, and the barrier includes a single-sided barrier structure between the display area and the welding area. The organic insulating structure is arranged on the substrate and includes a plurality of sub-insulating structures which are arranged in a stacked mode, a portion of each sub-insulating structure is located in the display area, and another portion of each sub-insulating structure is located in the peripheral area. Each of the sub-insulating structures has a first boundary between the display area and the single-sided barrier structure, and each of the remaining sub-insulating structures except the sub-insulating structure farthest from the substrate SUB includes an extension, and for any two adjacent sub-insulating structures, the extension of the sub-insulating structure proximal to the substrate SUB is located between the first boundary of the sub-insulating structure away from the substrate SUB and the single-sided barrier structure. The touch electrode pattern is arranged on a side of the organic insulating structure away from the substrate, and is located in the display area. The touch signal line is arranged on a side of the organic insulating structure away from the substrate, a terminal of the touch signal line is electrically coupled to the touch electrode pattern, another terminal of the touch signal line is coupled to the welding area, and an orthographic projection of a portion, in the peripheral area, of the touch signal line on the substrate overlaps with an orthographic projection of the extension of each sub-insulating structure on the substrate.

The sub-insulating structure with the extension is formed by patterning an organic material layer by using a two-tone mask plate, where when a process of patterning is performed, an area where the extension is to be formed corresponds to a semi-light-transmitting area of the two-tone mask plate.

In some implementations, the sub-insulating structures of the organic insulating structure include: a first planarization layer, a second planarization layer, and a pixel defining layer. The first planarization layer is arranged on the substrate; the second planarization layer is positioned on a side of the first planarization layer away from the substrate; the pixel defining layer is located on a side of the second planarization layer away from the substrate.

Figure 12:
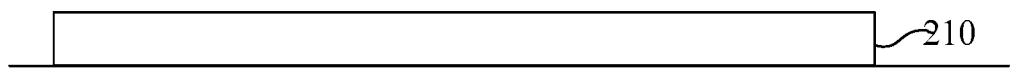
FIGS. 12 to 14 are schematic diagrams illustrating a process for manufacturing of a sub-insulating structure having an extension part according to an embodiment of the present disclosure.
Figure 13:
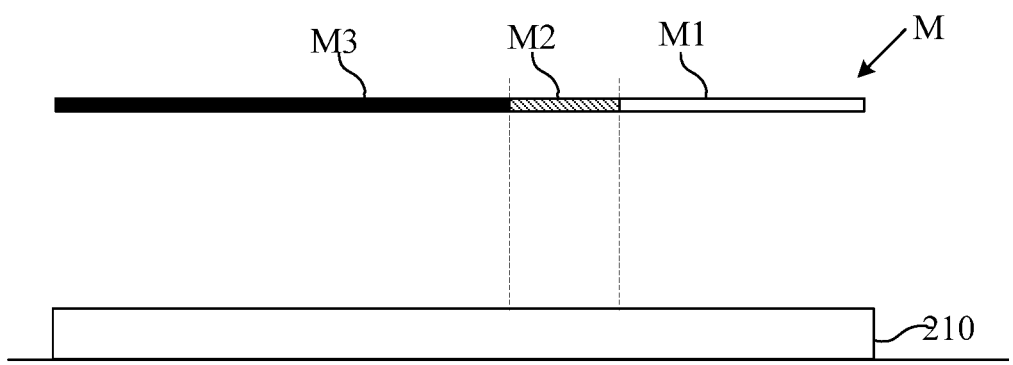
Figure 14:
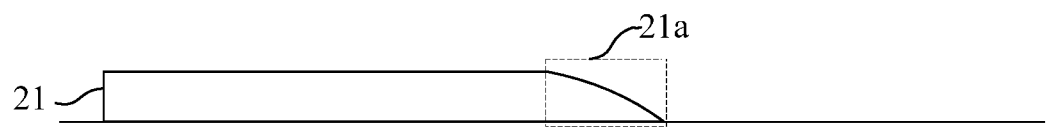

FIG. 12 to FIG. 14 are schematic diagrams illustrating a process for manufacturing a sub-insulating structure with an extension according to an embodiment of the present disclosure, and the process for manufacturing the sub-insulating structure with the extension is described below as an example. The sub-insulating structure may be a first planarization layer or a second planarization layer.

As shown in FIG. 12, an organic insulating material layer 210 is formed, wherein the organic insulating material layer 210 is a photosensitive organic material layer, such as a positive photoresist layer.

As shown in FIG. 13, the photoresist layer is exposed by using a two-tone mask plate M. The two-tone mask plate M is a gray tone mask plate or a half tone mask plate. The two-tone mask plate M includes a full light-transmitting area M1, a non-light-transmitting area M3 and a semi-light-transmitting area M2, where a light transmittance of the semi-light-transmitting area M2 is less than that of the full light-transmitting area M1. Taking the organic insulating material layer 210 being the positive photoresist layer as an example, during exposure, the semi-light-transmitting area M2 of the two-tone mask plate M corresponds to an area where the extension is to be formed, the full light-transmitting area M1 of the two-tone mask plate M corresponds to an area where the organic insulating material layer 210 needs to be completely removed, and the non-light-transmitting area M3 of the two-tone mask plate M corresponds to other areas. After exposure, a portion of the organic insulating material layer 210 corresponding to the non-light-transmitting area is not exposed, a portion of the organic insulating material layer 210 corresponding to the full light-transmitting area is completely exposed, and a portion of the organic insulating material layer 210 corresponding to the semi-light-transmitting area is partially exposed.

Thereafter, the organic insulating material layer 210 is developed, such that the portion of the organic insulating material layer 210 corresponding to the full light-transmitting area M1 is completely removed, the portion of the organic insulating material layer 210 corresponding to the semi-light-transmitting area M2 is partially removed, the portion of the organic insulating material layer 210 corresponding to the non-light-transmitting area M3 is completely remained, and the formed pattern is the sub-insulating structure 21, as shown in FIG. 14. The portion of the sub-insulating structure 21 corresponding to the semi-light-transmitting area M2 is an extension 21a, and a surface of the extension 21a is a gentle slope.

It should be understood that in the process of patterning described above, a negative photoresist layer may also be used, in such case, a pattern of mask plate to be used is complementary to that of the two-tone mask plate M described above.

In the embodiment of the present disclosure, the sub-insulating structure 21 having the extension 21a is formed by performing a process of patterning on the organic material layer 210 by using a two-tone mask plate, and during exposure, an area where the extension 21a is to be formed corresponds to the semi-light-transmitting area M2 of the two-tone mask plate M, so that the formed extension 21a has a slope, and therefore, an entire side surface of the organic insulating structure 20 is relatively flat, and when touch signal lines are subsequently manufactured by an etching process, residues of conductive substances can be reduced, thereby reducing or preventing a short-circuit between the touch signal lines.

In the embodiment, the structure of the barrier 20, the structure and the material of the pixel defining layer PDL, the structure and the material of the first planarization layer PLN1, and the structure and the material of the second planarization layer PLN2 may all refer to the description in the above embodiment, and will not be described herein again.

In addition, in the embodiment, an encapsulation layer and a touch insulating layer are further disposed on the organic insulating structure. A light emitting element may further be provided in the display area of the substrate, and the light emitting element is coupled to a second power supply line. The specific structure and the material of the encapsulation layer, the arrangement manner and the material of the touch insulating layer, the structure and the material of the light emitting element, and the arrangement manner of the second power supply line and the touch signal line may refer to the descriptions in the above embodiment, and are not described herein again.

An embodiment of the present disclosure further provides a display device, which includes the display panel of the above embodiment. The display device may be any product or component with a display function, such as an OLED panel, a mobile phone, a tablet personal computer, a television, a display, a notebook computer, a digital photo frame, a navigator and the like.

It will be understood that above embodiments are merely exemplary embodiments employed to illustrate principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A display panel, comprising:
    a substrate, a display area, a peripheral area and a welding area, wherein the peripheral area surrounds the display area, and the welding area is positioned on a side of the peripheral area away from the display area;
    at least one barrier disposed on the substrate, the barrier being located in the peripheral area and surrounding the display area, the barrier comprising a single-sided barrier structure located between the display area and the welding area;
    an organic insulating structure disposed on the substrate, the organic insulating structure comprising a plurality of sub-insulating structures disposed in a stacked manner, each of the sub-insulating structures having a first boundary located between the display area and the single-sided barrier structure, wherein, for at least two adjacent ones of the sub-insulating structures, the first boundary of the sub-insulating structure on a side away from the substrate is closer to the display area than the first boundary of the sub-insulating structure on a side proximal to the substrate;
    a touch electrode pattern arranged on a side of the organic insulating structure away from the substrate;
    a touch signal line arranged on a side of the organic insulating structure away from the substrate, a terminal of the touch signal line is electrically coupled to the touch electrode pattern, another terminal of the touch signal line is coupled to the welding area, and an orthographic projection of a portion, in the peripheral area, of the touch signal line on the substrate intersects with the first boundary of each of the sub-insulating structures,
    a space exists between the first boundary of each of the sub-insulating structures and the single-sided barrier structure.

2. The display panel according to claim 1, wherein a distance between first boundaries of at least two adjacent ones of the sub-insulating structures is greater than or equal to 20 μm.

3. The display panel according to claim 2, wherein the distance between the first boundaries of any adjacent two of the sub-insulating structures is between 25 μm and 60 μm.

4. The display panel according to claim 1, wherein the sub-insulating structures of the organic insulating structure comprise at least two of:
- a first planarization layer disposed on the substrate;
- a second planarization layer located on a side of the first planarization layer away from the substrate; or
- a pixel defining layer positioned on a side of the second planarization layer away from the substrate.

5. The display panel according to claim 1, further comprising: an encapsulation layer arranged on a side of the organic insulating structure away from the substrate;
- the touch electrode pattern and the touch signal line are both positioned on a side of the encapsulation layer away from the substrate.

6. The display panel according to claim 5, wherein a recess is formed between the organic insulating structure and the single-sided barrier structure, an orthographic projection of the encapsulation layer on the substrate simultaneously covers an orthographic projection of the organic insulating structure on the substrate, an orthographic projection of the recess on the substrate, and an orthographic projection of the single-sided barrier structure on the substrate, the single-sided barrier structure being between the substrate and the encapsulation layer.

7. The display panel according to claim 5, further comprising: a touch insulating layer arranged on a side of the encapsulation layer away from the substrate;
- the touch electrode pattern comprises a plurality of touch driving electrodes and a plurality of touch sensing electrodes, the touch driving electrodes intersect with the touch sensing electrodes, the touch driving electrodes and the touch sensing electrodes are insulated and spaced from each other by the touch insulating layer at intersection positions between the touch driving electrodes and the touch sensing electrodes, and each of the touch driving electrode and the touch sensing electrode is correspondingly coupled to one touch signal line,
- wherein the touch driving electrodes comprise: a plurality of driving electrode elements arranged along a first direction and coupling parts coupled between every two adjacent ones of the driving electrode elements;
- the touch sensing electrodes comprise: a plurality of sensing electrode elements arranged along a second direction, and bridge parts coupled between every two adjacent ones of the sensing electrode elements;
- the first direction intersects with the second direction, the driving electrode elements, the coupling parts and the sensing electrode elements are located on a side of the touch insulating layer away from the substrate, and located in a single layer, and the bridge parts are located between the touch insulating layer and the encapsulation layer,
- wherein the touch signal line comprises a first transmission portion and a second transmission portion, the first transmission portion is located between the touch insulating layer and the encapsulation layer, the second transmission portion is located on a side of the touch insulating layer away from the encapsulation layer, and the second transmission portion is electrically coupled to the first transmission portion through a via hole penetrating through the touch insulating layer.

8. The display panel according to claim 1, wherein the display area comprises a plurality of pixel units each having a light emitting element disposed therein, and the display panel further comprises a power supply line electrically coupled to the light emitting element, wherein the power supply line is located between the organic insulating structure and the substrate, and an orthographic projection of the power supply line on the substrate overlaps with an orthographic projection of the first boundary on the substrate.

9. The display panel according to claim 4, further comprising:
- a first buffer layer disposed on the substrate;
- a semiconductor layer disposed between the first buffer layer and the first planarization layer;
- a first gate insulating layer disposed between the semiconductor layer and the first planarization layer;
- a first gate electrode layer provided between the first gate insulating layer and the first planarization layer;
- a second gate insulating layer provided between the first gate electrode layer and the first planarization layer;
- a second gate electrode layer provided between the second gate insulating layer and the first planarization layer;
- an interlayer insulating layer provided between the second gate electrode layer and the first planarization layer;
- a first source-drain conductive layer arranged between the interlayer insulating layer and the first planarization layer;
- a second source-drain conductive layer arranged between the first planarization layer and the second planarization layer;
- a first electrode layer disposed between the second planarization layer and the pixel defining layer, the first electrode layer comprising a plurality of first electrodes, the pixel defining layer comprising pixel openings in one-to-one correspondence with the first electrodes;
- a light emitting layer disposed in the pixel openings;
- a second electrode layer arranged on a side of the light emitting layer away from the substrate;
- an encapsulation layer arranged on a side of the light emitting layer away from the substrate;
- a second buffer layer arranged on a side of the encapsulation layer away from the substrate,
- wherein the touch electrode pattern and the touch signal line are arranged on a side of the second buffer layer away from the substrate.

10. A display device, comprising the display panel according to claim 1.

11. A display panel, comprising:
- a substrate, comprising a display area, a peripheral area and a welding area, wherein the peripheral area surrounds the display area, and the welding area is positioned on a side of the peripheral area away from the display area;
- at least one barrier disposed on the substrate, the barrier being located in the peripheral area and surrounding the display area, the barrier comprising a single-sided barrier structure located between the display area and the welding area;
- an organic insulating structure arranged on the substrate, a portion of the organic insulating structure is located in the display area, another portion of the organic insulating structure is located in the peripheral area, the organic insulating structure is provided with a bottom surface facing the substrate, a top surface opposite to the bottom surface, and a first side surface between the bottom surface and the top surface and faces the single-side barrier structure, an orthographic projection of the top surface on the substrate is within an orthographic projection of the bottom surface on the substrate, and an included angle between the bottom surface and the first side surface ranges from 0° to 40°;
a touch electrode pattern arranged on a side of the organic insulating structure away from the substrate;
a touch signal line arranged on a side of the organic insulating structure away from the substrate, a terminal of the touch signal line is electrically coupled to the touch electrode pattern, another terminal of the touch signal line is coupled to the welding area, and an orthographic projection of a portion, in the peripheral area, of the touch signal line on the substrate passes through an orthographic projection of the first side surface on the substrate,
wherein the first side surface is spaced apart from the single-sided barrier structure.

12. The display panel according to claim 11, wherein the included angle between the bottom surface and the first side surface is between 25° and 35°.

13. The display panel according to claim 11, wherein the sub-insulating structures of the organic insulating structure comprise at least two of:
a first planarization layer disposed on the substrate;
a second planarization layer located on a side of the first planarization layer away from the substrate; or
a pixel defining layer positioned on a side of the second planarization layer away from the substrate.

14. The display panel according to claim 11, further comprising: an encapsulation layer arranged on a side of the organic insulating structure away from the substrate;
the touch electrode pattern and the touch signal line are both positioned on a side of the encapsulation layer away from the substrate,
wherein a recess is formed between the organic insulating structure and the single-sided barrier structure, an orthographic projection of the encapsulation layer on the substrate simultaneously covers an orthographic projection of the organic insulating structure on the substrate, an orthographic projection of the recess on the substrate, and an orthographic projection of the single-sided barrier structure on the substrate, the single-sided barrier structure being between the substrate and the encapsulation layer.

15. The display panel according to claim 14, further comprising: a touch insulating layer arranged on a side of the encapsulation layer away from the substrate;
the touch electrode pattern comprises a plurality of touch driving electrodes and a plurality of touch sensing electrodes, the touch driving electrodes intersect with the touch sensing electrodes, the touch driving electrodes and the touch sensing electrodes are insulated and spaced from each other by the touch insulating layer at intersection positions between the touch driving electrodes and the touch sensing electrodes, and each of the touch driving electrode and the touch sensing electrode is correspondingly coupled to one touch signal line,
wherein the touch driving electrodes comprise: a plurality of driving electrode elements arranged along a first direction and coupling parts coupled between every two adjacent ones of the driving electrode elements;
the touch sensing electrodes comprise a plurality of sensing electrode elements arranged along a second direction, and bridge parts coupled between every two adjacent ones of the sensing electrode elements;
the first direction intersects with the second direction, the driving electrode elements, the coupling parts and the sensing electrode elements are located on a side of the touch insulating layer away from the substrate, and located in a single layer, and the bridge parts are located between the touch insulating layer and the encapsulation layer,
wherein the touch signal line comprises a first transmission portion and a second transmission portion, the first transmission portion is located between the touch insulating layer and the encapsulation layer, the second transmission portion is located on a side of the touch insulating layer away from the encapsulation layer, and the second transmission portion is electrically coupled to the first transmission portion through a via hole penetrating through the touch insulating layer.

16. The display panel according to claim 11, wherein the display area comprises a plurality of pixel units each having a light emitting element disposed therein, and the display panel further comprises a power supply line electrically coupled to the light emitting element, wherein the power supply line is located between the organic insulating structure and the substrate, and an orthogonal projection of the power supply line on the substrate overlaps with an orthogonal projection of the first side surface on the substrate.

17. The display panel according to claim 13, further comprising
a first buffer layer disposed on the substrate;
a semiconductor layer disposed between the first buffer layer and the first planarization layer;
a first gate insulating layer disposed between the semiconductor layer and the first planarization layer;
a first gate electrode layer provided between the first gate insulating layer and the first planarization layer;
a second gate insulating layer provided between the first gate electrode layer and the first planarization layer;
a second gate electrode layer provided between the second gate insulating layer and the first planarization layer;
an interlayer insulating layer provided between the second gate electrode layer and the first planarization layer;
a first source-drain conductive layer arranged between the interlayer insulating layer and the first planarization layer;
a second source-drain conductive layer arranged between the first planarization layer and the second planarization layer;
a first electrode layer disposed between the second planarization layer and the pixel defining layer, the first electrode layer comprising a plurality of first electrodes, the pixel defining layer comprising pixel openings in one-to-one correspondence with the first electrodes;
a light emitting layer disposed in the pixel openings;
a second electrode layer arranged on a side of the light emitting layer away from the substrate;
an encapsulation layer arranged on a side of the light emitting layer away from the substrate;
a second buffer layer arranged on a side of the encapsulation layer away from the substrate.

18. A display panel, comprising:
a substrate, comprising a display area, a peripheral area and a welding area, wherein the peripheral area surrounds the display area, and the welding area is positioned on a side of the peripheral area away from the display area;

at least one barrier disposed on the substrate, the barrier being located in the peripheral area and surrounding the display area, the barrier comprising a single-sided barrier structure located between the display area and the welding area;

an organic insulating structure disposed on the substrate, a portion of the organic insulating structure being located in the display area, another portion of the organic insulating structure being located in the peripheral area, the organic insulating structure having a step structure on a side thereof close to the single-sided barrier structure, the step structure comprising at least two steps, and in a direction from the display area to the peripheral area, heights of the at least two steps being gradually reduced;

a touch electrode pattern arranged on a side of the organic insulating structure away from the substrate;

a touch signal line arranged on a side of the organic insulating structure away from the substrate, a terminal of the touch signal line is electrically coupled to the touch electrode pattern, another terminal of the touch signal line is coupled to the welding area, and an orthographic projection of a portion, in the peripheral area, of the touch signal line on the substrate overlaps with an orthographic projection of the step structure of the organic insulating structure on the substrate.

19. The display panel according to claim 18, wherein a distance between boundaries of any two adjacent steps is greater than or equal to 20 μm.

20. The display panel according to claim 18, wherein the sub-insulating structures of the organic insulating structure comprise at least two of:

a first planarization layer disposed on the substrate;

a second planarization layer located on a side of the first planarization layer away from the substrate; or a pixel defining layer positioned on a side of the second planarization layer away from the substrate.

* * * * *